US012802751B2

(12) United States Patent
Jain et al.

(10) Patent No.: US 12,802,751 B2
(45) Date of Patent: Nov. 17, 2026

(54) MEMORY CIRCUITS WITH READ ENABLE GENERATION CIRCUITS AND METHODS FOR OPERATING THE SAME

(71) Applicant: Taiwan Semiconductor Manufacturing Company, Ltd., Hsinchu (TW)

(72) Inventors: Sanjeev Kumar Jain, Hsinchu City (TW); Atul Katoch, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 146 days.

(21) Appl. No.: 18/748,972

(22) Filed: Jun. 20, 2024

(65) Prior Publication Data

US 2025/0252994 A1 Aug. 7, 2025

Related U.S. Application Data

(60) Provisional application No. 63/550,827, filed on Feb. 7, 2024.

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .......................... G11C 11/418; G11C 11/419
USPC ................................................. 365/189.011
See application file for complete search history.

(56) References Cited

U.S. PATENT DOCUMENTS 11,437,091 B2 * 9/2022 Jung ...................... G11C 7/08
12,159,664 B2 * 12/2024 Gupta ................. G11C 11/419
2008/0002497 A1 1/2008 Barth et al.
2008/0137459 A1 6/2008 Morishima (Continued)

FOREIGN PATENT DOCUMENTS

KR 10-2022-0148257 A 11/2022

OTHER PUBLICATIONS

Office Action issued in Taiwan Appl. No. 113130783 dated Apr. 24, 2025.

(Continued)

*Primary Examiner* — Sung Il Cho
(74) *Attorney, Agent, or Firm* — Foley & Lardner LLP

(57) ABSTRACT

A memory circuit includes a first memory cell operatively accessible through a first access line and a second access line; a first read pass-gate transistor and a second read pass-gate transistor coupled to the first access line and second access line, respectively; a first sense amplifier coupled to the first access line and the second access line; a first read enable control circuit configured to generate a first read enable signal based on a clock signal; and a second read enable control circuit configured to generate a second read enable signal. The first read enable signal selectively transitions to a different logic state based on a first sense enable signal. The second read enable signal is configured to activate or deactivate both the first and second read pass-gate transistors, and the first sense enable signal is configured to activate or deactivate the first sense amplifier.

20 Claims, 9 Drawing Sheets

(56) References Cited

U.S. PATENT DOCUMENTS

2019/0147942 A1 5/2019 Jain et al.
2022/0336009 A1* 10/2022 Jain ...................... G11C 11/419

OTHER PUBLICATIONS

Office Action issued in Korean Appl. No. 10-2025-0013828 dated Aug. 21, 2025.

* cited by examiner

MEMORY CIRCUITS WITH READ ENABLE GENERATION CIRCUITS AND METHODS FOR OPERATING THE SAME

CROSS-REFERENCE TO RELATED APPLICATION

This application claims priority to and the benefit of U.S. Provisional Application No. 63/550,827, filed Feb. 7, 2024, entitled "READ ENABLE GENERATION CIRCUIT IN MULTI BANK SRAM," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
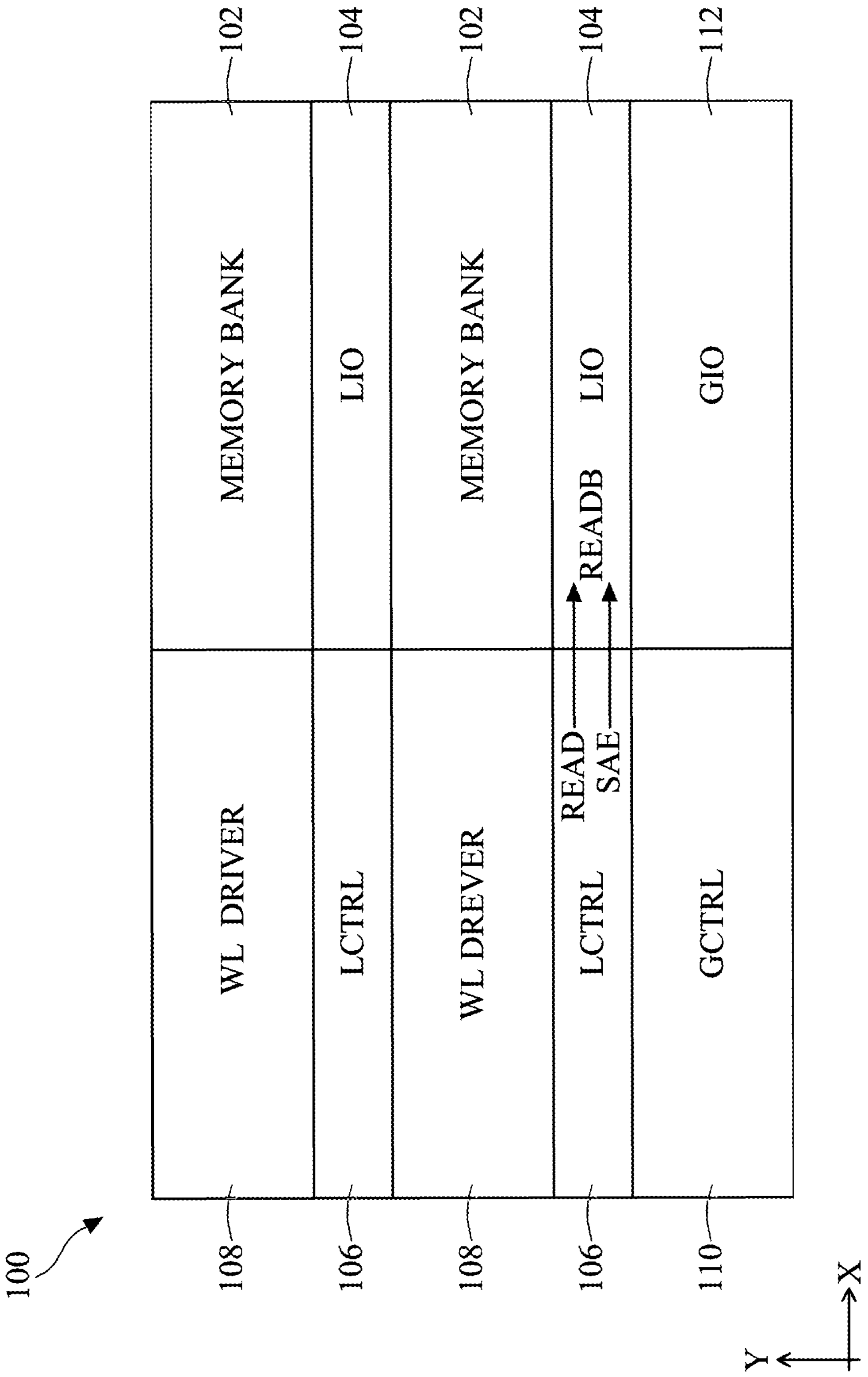
FIG. 1 illustrates an example block diagram of a memory circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device is a type of volatile semiconductor memory that stores data bits using bi-stable circuitry. Bi-stable circuitry will maintain the integrity of a stored bit without refreshing. A single SRAM cell is generally referred to as a bit cell because the single SRAM cell stores one bit of information, represented by a logic state of two cross coupled inverters. A memory array includes multiple bit cells arranged in rows and columns. In some approaches, each bit cell in a memory array includes a connection to a power supply voltage and a connection to a reference voltage. Logic signals on first access lines (e.g., bit lines) control reading from and writing to a bit cell, with a second access line (e.g., a word line) controlling connections of the bit lines to the cross-coupled inverters through pass gates. When the pass gates are in a non-conductive state, the bit cell floats.

Scaling of semiconductor devices, e.g., a metal-oxide semiconductor field-effect transistor (MOSFET), has enabled continued improvement in speed, performance, density, and cost per unit function of integrated circuits over the past few decades. With such a scaling trend, the number of bit cells of an SRAM circuit has exponentially increased, which causes the connection lines among different components of the SRAM circuit to become relatively long. In general, these extended connection lines disadvantageously impact performance (e.g., speed) of the SRAM circuit due to various limited clock paths such as, for example, a bit line pre-charge path, a write clock path, a word line path, a sense amplifier pre-charge path, a read clock path, etc. Among the most, performance of the existing SRAM circuits is typically limited by its read clock path, where contention between a read enable signal, configured for enabling reading out the data bit stored in a bit cell, and a sense enable signal, configured for amplifying the read out data bit, seems to become severer in accordance with the scaling trend. Thus, the existing SRAM circuits have not been entirely satisfactory in certain aspects.

The present disclosure provides various embodiments of a memory circuit including one or more memory arrays (or memory banks), each of which is operatively coupled with a local read enable control circuit. Commonly coupled to a global read enable control circuit, the local read enable control circuits are each configured to provide a read enable (READB) signal for activating/deactivating a corresponding read pass-gate circuit based on a sense enable (SAE) signal. With the local read enable control circuit directly controlled by the SAE signal, various time margins to differentiate a read operation and a sensing operation of the memory circuit can be advantageously optimized. For example, a first time margin (between the SAE signal pulled up and the READB signal pulled up) and a second time margin (between the SAE signal pulled down and the READB signal pulled down) can each be assured larger than a certain threshold. With the first time margin large enough, it can be assured that the bit lines of a corresponding sense amplifier are not floating; and with the second time margin large enough, it can be assured that the bit lines of the sense amplifier are not disturbed by a bit line pre-charge circuit. In various embodiments, the memory circuit can include a control circuit and an input/output (I/O) circuit physically disposed next to the memory arrays. The control circuit can include the global read enable control circuit, and the I/O circuit can include the read enable control circuits.

FIG. 1 illustrates an example block diagram of a memory circuit 100, in accordance with various embodiments of the present disclosure. In general, the memory circuit 100 includes a plural number of SRAM cells. However, the memory cells of the memory circuit 100 can be adapted for other semiconductor memories including, but not limited to, dynamic random access memories ("DRAMs"), erasable programmable read only memories ("EPROMs"), and electronically erasable programmable read only memories ("EEPROMs") as well as other read only memories ("ROMs"), random access memories ("RAMs"), and flash memories. It should be understood that the block diagram of FIG. 1 has been simplified for illustrative purposes, and thus, the memory circuit 100 can include any of various other components or circuits, while remaining within the scope of the present disclosure. For example, the memory circuit 100 can include one or more tracking circuits.

As shown, the memory circuit 100 includes a number of memory banks 102, a number of local input/output (LIO) blocks 104, a number of local control (LCTRL) blocks 106, a number of word line (WL) driver blocks 108, a global control (GCTRL) block 110, and a global input/output (GIO) block 112. Each of the memory banks 102 can include a number of memory array, each of which can include a number of SRAM cells. Each of the memory banks 102 can be operatively coupled with a corresponding one of the LIO blocks 104, a corresponding one of the LCTRL blocks 106, and a corresponding one of the WL driver blocks 108. The different LIO blocks 104 can be operatively coupled to the GIO block 112, and the different LCTRL blocks 106 and the different WL driver blocks 108 can be operatively coupled to the GCTRL block 110.

For example, the GCTRL block 110 can include a clock generator (or two clock generators, one configured for a read operation and the other configured for a write operation) to generate an internal clock (ICLK) signal. The ICLK signal can control the reading and writing to and from the SRAM cells of the memory banks 102. The GCTRL block 110 can include at least one X address decoder and one Y address decoder, which are configured to decode a first portion and a second portion of an address, respectively. The first portion of the address, upon being decoded, can be sent to the LIO block 104 through the LCTRL block 106 to identify one or more bit lines (BLs) of the memory bank 102; and the second portion of the address, upon being decoded, can be sent to the WL driver block 108 to assert one or more word lines (WLs) of the memory bank 102.

In various embodiments of the present disclosure, the LCTRL block 106 can include a global read enable control circuit configured to generate a global read enable (READ) signal based on the ICLK signal (provided by the GCTRL block 110). The LIO block 104 can include a number of local read enable control circuits, each of which is operatively coupled to a respective set of SRAM cells of the corresponding memory bank 102. The local read enable control circuits (of the LIO block 104) can commonly receive the READ signal (provided by the LCTRL block 106) to generate respective local read enable (READB) signals for the corresponding sets of SRAM cells. Each of the local read enable control circuits can be further controlled by a sense enable (SAE) signal generated by the LCTRL block 106. The READB signal can be configured to activate/deactivate at least one read pass-gate circuit coupled to the corresponding set of SRAM cells, and the SAE signal can be configured to activate/deactivate at least one sense amplifier circuit coupled to the corresponding set of SRAM cells. The local READB signal, logically inverse to the global READ signal, can be selectively tied to ground based on the SAE signal. Advantageously, it can be assured that the time margins between the read and sense operations are sufficiently large. Details of these signals will be further discussed below.

In various embodiments, each memory bank 102 may have its corresponding LIO block 104 disposed next to itself along the Y-direction and its corresponding LCTRL block 106 disposed next to the LIO block 104 along the X-direction, as shown in the example of FIG. 1. Further, the GIO block 112 may be spaced from the memory bank 102 with at least one LIO block 104 interposed therebetween along the Y-direction; and the GCTRL block 110 may be disposed next to the GIO block 112 along the X-direction. However, it should be understood that the arrangement of the blocks of the memory circuit 100 can be configured differently, while remaining within the scope of the present disclosure.

Figure 2:
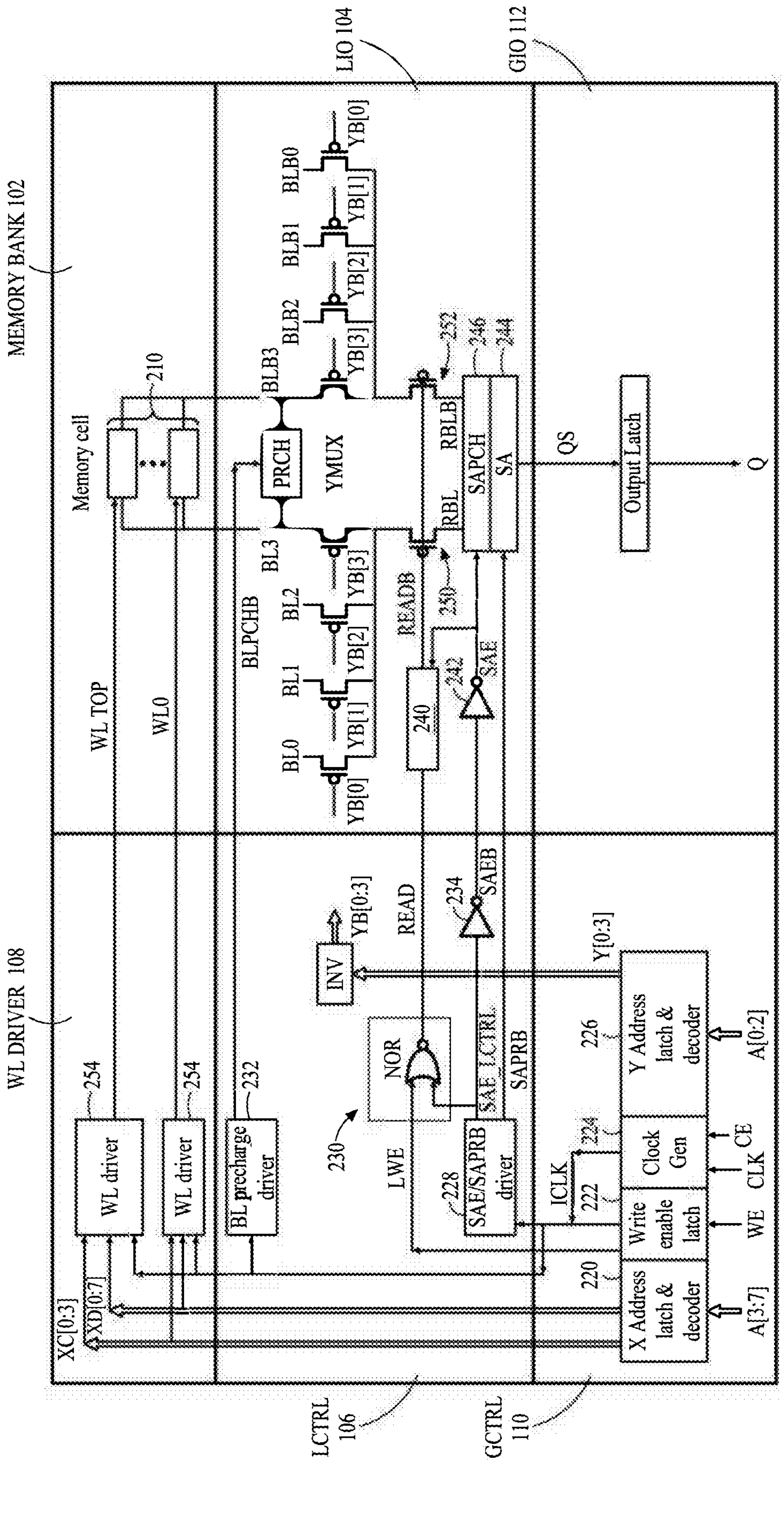
FIG. 2 illustrates an example schematic diagram of a portion of the memory circuit of FIG. 1, in accordance with some embodiments.

FIG. 2 illustrates an example schematic diagram of a portion of the memory circuit 100, in accordance with various embodiments of the present disclosure. For example, the schematic diagram of FIG. 2 includes the GCTRL block 110 and the GIO block 112, and a set of SRAM cells 210 of one of the memory arrays of one memory bank 102, with the corresponding LIO block 104, LCTRL block 106, and WL driver block 108. This set of SRAM cells 210 may be coupled between (e.g., accessed through) a pair of bit lines, e.g., BL3 and BLB3 shown in FIG. 2. Other sets of the SRAM cells of the same memory array coupled between BL2 and BLB2, between BL1 and BLB1, and between BL0 and BLB0 are not displayed for clarity purposes.

The SRAM cells 210 may each be implemented as a six-transistor (6T) SRAM cell. However, the SRAM cells 210 may be implemented as any of various other configurations such as, for example, an eight-transistor (8T) SRAM cell, a ten-transistor (10T) SRAM cell, etc., while remaining within the scope of the present disclosure. A 6T SRAM cell typically includes a first pass-gate transistor configured to selectively connect a pair of cross-coupled inverters to the first bit line, e.g., BL3, and a second pass-gate transistor configured to selectively connect the cross-coupled inverters to a second bit line, e.g., BLB3. The first pass-gate transistor and the second pass-gate transistor are both configured to be activated for enabling the access (e.g., read, write) of the SRAM cell based on a signal supplied by a word line, e.g., one of WL0 to WLTOP.

The GCTRL block 110 can include an X address decoder 220, a write enable latch 222, a clock generator 224, and an Y address decoder 226. The clock generator 224 can receive a clock source (CLK) to provide an internal clock (ICLK) signal to the LCTRL block 106 and the WL driver block 108. The write enable latch 222 can receive a write enable (WE) signal with a logic state indicating whether to initiate a write or read operation on the SRAM cell 210. For example, when the WE signal is at logic 0, the SRAM cell is configured to be read; and when the WE signal is at logic 1, the SRAM cell is configured to be written. The write enable latch 222 can then provide a latched write enable (LWE) signal to a global read enable control circuit 230 included in the LCTRL block 106, which will be discussed below.

In some implementation, the X address decoder 220 and the Y address decoder 226 can receive different portions (e.g., different bits) of an address signal, e.g., A[0:7]. Further, the X address decoder 220 can provide a decoded X signal for identifying one or more selected access lines extending in the X-direction (e.g., WLs), and the Y address decoder 226 can provide a decoded Y signal for identifying one or more selected access lines extending in the Y-direction (e.g., BLs). For example, the X address decoder 220 can decode a first portion of the address signal, e.g., A[3:7], and provide the decoded X signal, e.g., XC[0:3], XD [0:7], to the WL driver block 108 to assert the corresponding WL(s). The WL driver block 108 can include a plural number of WL drivers 254 correspond to the WLs, WL0 to WLTOP, respectively. The Y address decoder 226 can decode a second portion of the address signal, e.g., A[0:2], and provide the decoded Y signal, e.g., Y[0:3], to the LCTRL block 106 to select at least one pair of the BL/BLB. The decoded Y signal can be logically inverted by an inverter of the LCTRL block 106 as YB[0:3]. The YB[0:3] signal can be used to activate at least one pair of Y multiplexers (Y MUX'es) 262 that are coupled to the selected pair of BL/BLB. In the example where the Y MUX'es 262 are each implemented as a p-type metal-oxide-semiconductor (PMOS) field-effect-transistor (FET), when the bit YB[3] is provided at logic 0 and other bits, YB[0], YB[1], and YB[2] are each provided at logic 1, the Y MUX'es 262 respectively connected to the BL3 and BLB3 can be activated such that the pair of BL3 and BLB3 are selected.

The LCTRL block 106 can include a sense amplifier enable/sense amplifier pre-charge bit line (SA/SAPRB) driver 228 and a BL pre-charge driver 232. In some embodiments, the SA/SAPRB driver 228 can provide different control signals based on the ICLK signal to control (e.g., activate or deactivate) respective circuits included in the LIO block 104. Similarly, the BL pre-charge driver 232 can provide at least one control signal based on the ICLK signal to control (e.g., activate or deactivate) a circuit included in the LIO block 104.

Figure 8:
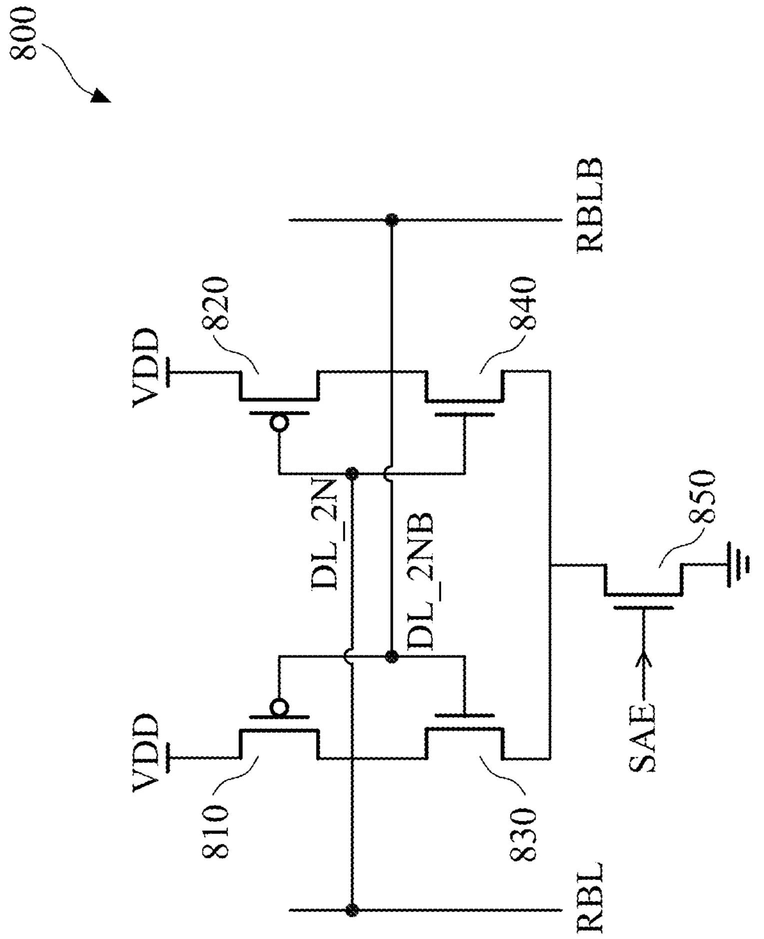
FIG. 8 illustrates an example circuit diagram of a sense amplifier, in accordance with some embodiments.

For example, the SA/SAPRB driver 228 is configured to receive the ICLK signal. Upon the ICLK signal transitioning to a different logic state (e.g., logic 1), the SA/SAPRB driver 228 can pull up a sense enable control (SAE_LCTRL) signal and a sense pre-charge bit line (SAPRB) signal. As such, the SAE_LCTRL signal and the SAPRB signal can each follow the ICLK signal. In some embodiments, the SAE_LCTRL signal can propagate through a first inverter to become a sense enable bar (SAEB) signal and then a second inverter to become a sense enable (SAE) signal. The SAE signal can be received by a sense amplifier 244 of the LIO block 104. The sense amplifier 244, an example implementation of which is illustrated in FIG. 8, can be activated by pulling up the SAE signal. Once being activated by the SAE signal (e.g., with the SAE signal being pulled up), the sense amplifier 244 can amplify a latched input value, which is a voltage sensed from a corresponding SRAM cell 210 and coupled to one of the sense amplifier 244's read bit lines, e.g., RBL or RBLB. In some embodiments, the SAPRB signal can be received by a sense amplifier pre-charge (SAPCH) circuit 246 of the LIO block 104. Once being activated by the SAPRB signal (e.g., with the SAPRB signal being pulled down), which typically occurs before the sense amplifier 244 is activated, the SAPCH circuit 246 can pre-charge the read bit lines, RBL and RBLB, to a common mid-range voltage, such as VDD/2.

The BL pre-charge driver 232 is configured to receive the ICLK signal. Upon the ICLK signal transitioning to a different logic state (e.g., logic 1), the BL pre-charge driver 232 can pull up a BL pre-charge bar (BLPCHB) signal. The BLPCHB signal can be received by a pre-charge (PRCH) circuit 260 of the LIO block 104. The PRCH circuit 260 can be activated by pulling down the BLPCHB signal. Once being activated by the BLPCHB signal (e.g., with the BLPCHB signal being pulled down), the PRCH circuit 260 can pre-charge the coupled pair of BL/BLB (e.g., BL3 and BLB3 in the example of FIG. 2) to VDD, typically prior to a read operation of the SRAM cell 210.

According to various embodiments of the present disclosure, the global read enable control circuit 230 can include a NOR logic gate, with a first input, a second input, and an output. The first input is configured to receive (coupled to) the LWE signal, and the second input is configured to receive (coupled to) the SAE_LCTRL signal. As such, the global read enable control circuit 230 can provide the local READB signal as XOR'ing the LWE signal and SAE_LCTRL signal. In a read or sense operation, the LWE signal may be provided at logic 0, which makes the global READ signal logically inverse to the SAE_LCTRL signal. As will be discussed below, the global READ signal is received by a local read enable control circuit 242 included in the LIO block 104 that also receives the SAE signal. The local read enable control circuit 242 can logically invert the global READ signal, and further adjust respective timings of a rising edge and a falling edge of the local READB signal based on the SAE signal.

The local READ signal can be received by a read pass-gate circuit included in the LIO block 104. In some embodiments, the read pass-gate circuit may include a pair of PMOS FETS, 250 and 252, that are configured to selectively couple the selected pair of BL/BLB (e.g., BL3 and BLB3) to the sense amplifier 244. The PMOS FETs 250 and 252, when activated, can couple the selected pair of BL/BLB to the sense amplifier 244. In the example of FIG. 2, the selected pair of BL/BLB on one side of the PMOS FETs 250 and 252 (e.g., the side of their source terminals) may become the pair of RBL/RBLB on the other side of the PMOS FETs 250 and 252 (e.g., the side of their drain terminals), when the PMOS FETs 250 and 252 are activated or turned on. The PMOS FETs 250 and 252 may have their gate terminals commonly coupled to the local READB signal. Consequently, when the local READB signal is at logic 0, the read pass-gate circuit (the PMOS FETs 250 and 252) can be activated; and when the local READB signal is at logic 1, the read pass-gate circuit (the PMOS FETs 250 and 252) can be deactivated.

The LIO block 104, which can be coupled to a memory bank, can include one or more sets of the circuit components (e.g., 240, 244, 246, 250, 252, 260, and 262) shown in FIG. 2. For example in FIG. 2, one set of 240, 244, 246, 250, 252, 260, and 262 is shown as operatively coupled to a corresponding set of the SRAM cells 210 that may belong to a first memory array of the memory bank. In some implementations, other sets of the SRAM cells 210 in the same first memory array, which are coupled to (or accessed through) other pairs of BL/BLB (e.g., BL2/BLB2, BL1/BLB1, BLO/BLBO), may have their own PRCH circuits 260 but share the same Y MUX'es 262, read pass-gate circuit 250/252, SAPCH circuit 246, and sense amplifier 244. Accordingly, the LIO block 104 can have other sets of the circuit components 240 to 262 coupled to other memory arrays of the same memory bank, respectively.

Figure 3:
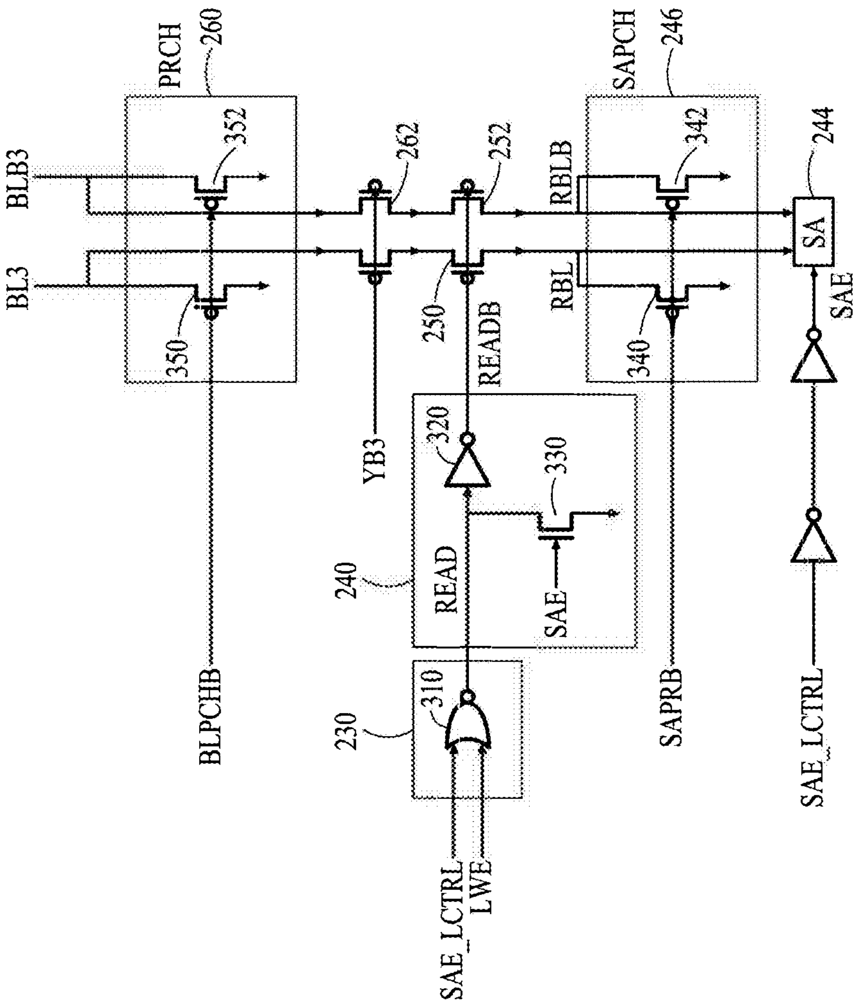
FIG. 3 illustrates an example circuit diagram of the portion of the memory circuit shown in FIG. 2, in accordance with some embodiments.

FIG. 3 illustrates an example circuit diagram of the portion of the memory circuit 100 shown in FIG. 2, in accordance with various embodiments of the present disclosure. Accordingly, some of the circuit components such as one pair of the Y MUX'es 262 gated by the YB[3] signal, the read pass-gate circuit (PMOS FETs 250 and 252), and the sense amplifier 244 are illustrated in FIG. 3 as well. It should be understood that the circuit diagram of FIG. 3 has been simplified for illustrative purposes.

As further shown in FIG. 3, the global read enable control circuit 230 includes a NOR gate 310; the local read enable control circuit 240 includes an inverter 320 and an NMOS FET 330; the SAPCH circuit 246 includes a pair of PMOS FETs 340 and 342; and the PRCH circuit 260 includes a pair of PMOS FETs 350 and 352. Specifically, the NOR gate 310 can perform a NOR operation on the SAE LCTRL signal and the LWE signal to provide the global READ signal. The global READ signal is received by the inverter 320, and further received at a drain terminal of the transistor 330, where the transistor 330 is gated by the SAE signal and sourced to ground. The inverter 320 can provide the local READB signal as the inverted global READ signal, the timings of a rising edge and falling edge of which can be adjusted by the transistor 330 that is gated by the SAE signal. In some embodiments, the sense amplifier 244 is activated for a sense operation which follows a previous read operation performed on the selected SRAM cell, and during the sense operation, no pre-charge operation is performed on the BL3/BLB3 or the RBL/RBLB. For example, during the sense operation, the PRCH circuit 260 (or the PMOS FETs 350 and 352) may be deactivated by keeping the BLPCHB signal at logic 1; and the SAPCH circuit 246 (or the PMOS FETs 340 and 342) may be deactivated by keeping the SAPRB signal at logic 1. Example waveforms of the local READB signal, the SAE signal, the BLPCHB signal, and the SAPRB signal will be provided and discussed in FIG. 4.

Figure 4:
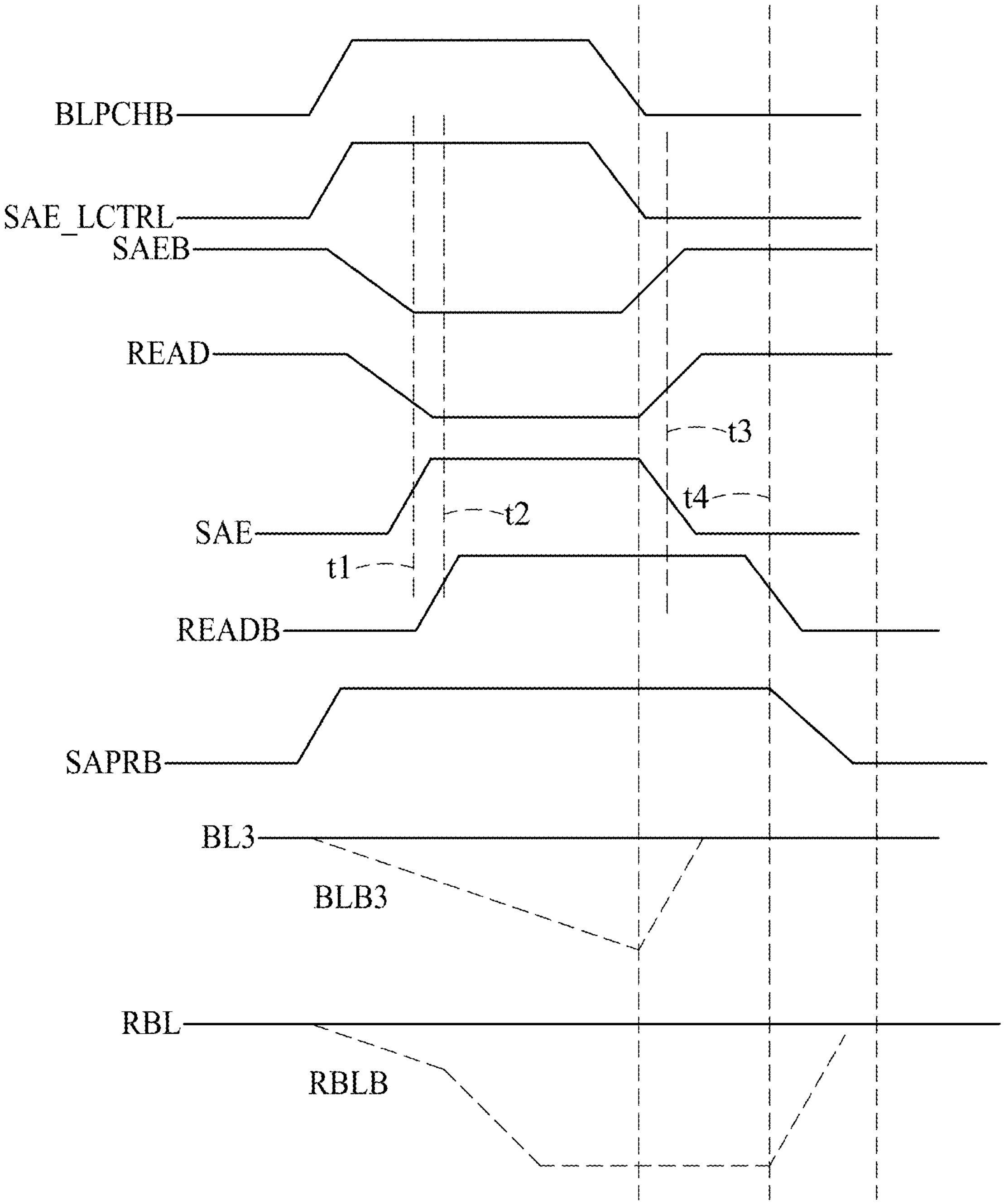
FIG. 4 illustrates example waveforms of various signals while operating the memory circuit of FIG. 1, in accordance with some embodiments.

FIG. 4 illustrates example waveforms of multiple signals when operating the memory circuit 100 (implemented according to the circuit diagram of FIG. 3) in a sense operation, in accordance with various embodiments of the present disclosure. For example, example waveforms of the BLPCH signal, the SAE_LCTRL signal, the SAEB signal, the global READ signal, the SAE signal, the local READB signal, the SAPRB signal, and voltages presented on the BL3/BLB3/RBL/RBLB over time (e.g., during a sense operation) are shown in FIG. 4. Generally, the sense operation is performed after a first read operation performed on the memory circuit 100, and a second, next read operation will not be performed until the sense operation is completely finished.

As shown, the BLPCHB signal, the SAE_LCTRL signal, and the SAPRB signal are pulled up, following a rising edge of the ICLK signal. With the BLPCH signal and the SAPRB signal pulled up to logic 1, the PRCH circuit 260 and the SAPCH circuit 246 are deactivated. With the SAE_LCTRL signal pulled up to logic 1, the SAEB signal is pulled down, followed by the SAE signal to be pulled up. As the SAE_LCTRL signal is at logic 1 (with the LWE signal kept at logic 0), the global READ signal is outputted by the NOR gate 310 of the global read enable control circuit 230 at logic 0. Concurrently, the global READ signal is also pulled down by the transistor 330 of the local read enable control circuit 240, which is activated or turned on by the SAE signal, to logic 0, and thus, the local READB signal is pulled up to logic 1. In other words, the global READ signal is coupled to ground through the activated transistor 330. The timing of a rising edge of the local READB signal ("$t_2$") can be controlled based on the timing of a rising edge of the SAE signal ("$t_1$"). Once the SAE signal is pulled up to logic 1, the sense amplifier 244 is activated to perform the sense (and amplification) operation, and when done, the SAE_LCTRL signal is pulled down to logic 0, which causes the SAE signal to transition to logic 0 at "$t_3$." With the SAE signal pulled down to logic 0, the transistor 330 of the local read enable control circuit 240 is deactivated or turned off. Consequently, the global READ signal is decoupled from ground, which may advantageously extend the timing of a falling edge of the local READB signal ("$t_4$").

In some implementation, a first timing margin is determined as $t_2$-$t_1$ (i.e., the timing of the rising edge of the local READB signal minus the timing of the rising edge of the SAE signal), and a second timing margin is determined as $t_4$-$t_3$ (i.e., the timing of the falling edge of the READB signal minus the timing of the falling edge of the SAE signal). With the local READB signal controlled by the SAE signal through the local read enable control circuit 240, the first timing margin and the second timing margin can each be assured to be sufficiently large (e.g., larger than 10%), regardless of the RC mismatch between the propagation paths to receive the SAE_LCTRL signal and the LWE signal. Given the first timing margin large enough, it can be advantageously assured that the RBL and RBLB of the sense amplifier 244 will not be floating. Further, given the second timing margin large enough, it can be advantageously assured that the PRCH circuit 260 will not disturb the RBL and RBLB of the sense amplifier 244.

Figure 5:
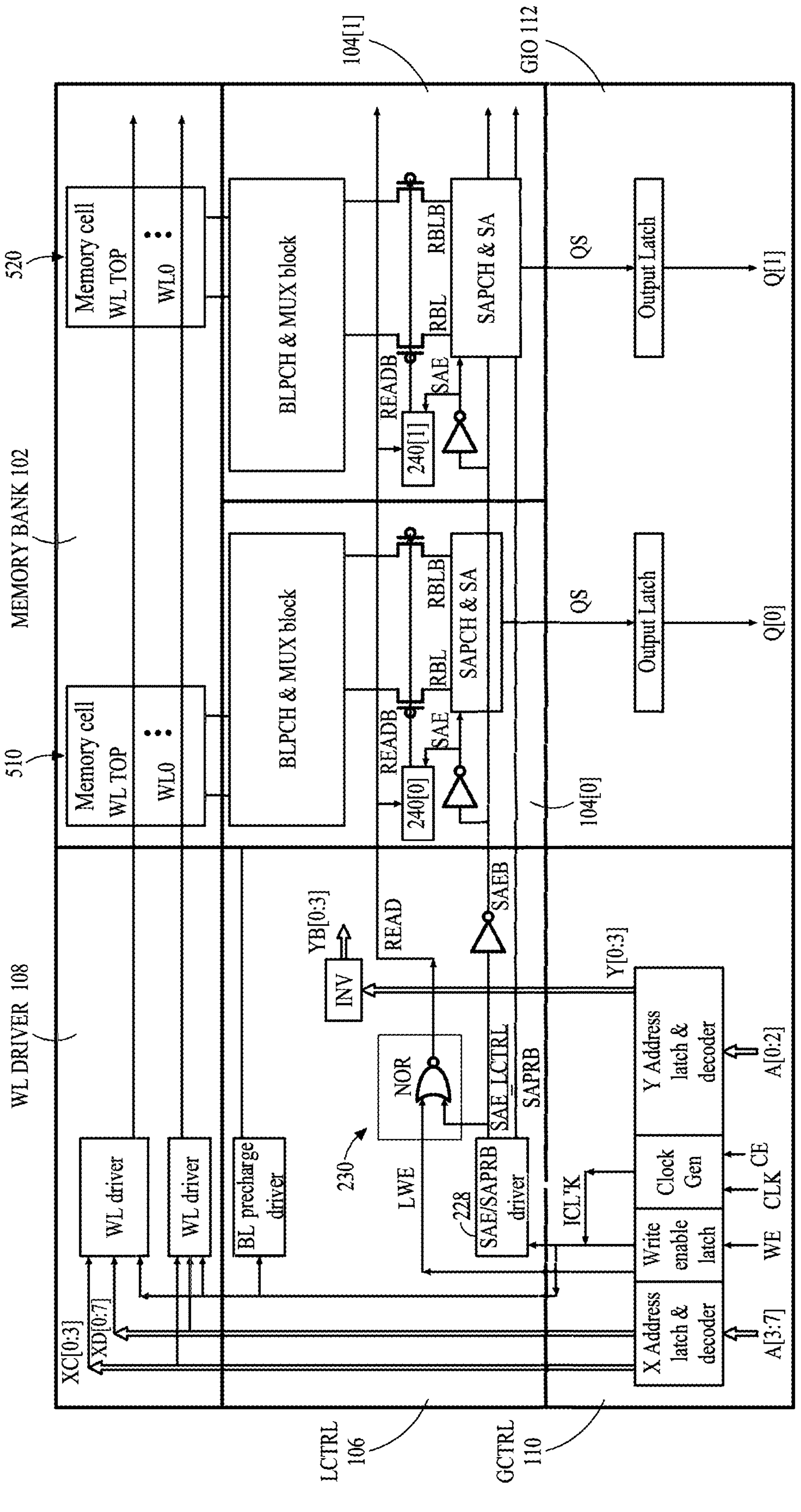
FIG. 5 illustrates another example schematic diagram of a portion of the memory circuit of FIG. 1, in accordance with some embodiments.

FIG. 5 illustrates another example schematic diagram of a portion of the memory circuit 100, in accordance with various embodiments of the present disclosure. Based on the schematic diagram of FIG. 5, FIG. 6 and FIG. 7 illustrate example circuit diagrams of the portion of the memory circuit 100 shown in FIG. 5, respectively.

Referring first to FIG. 5, two different sets of the SRAM cells, 510 and 520, are included in the memory bank 102. Such two sets of the SRAM cells 510 and 520 may belong to respectively different memory arrays of one memory bank, or belong to respectively different sub-arrays of one memory array. Generally, the sets 510 and 520 are coupled to respective sets of BL(s) and BLB(s) or to a respective set of RBL and RBLB. In some embodiments, the sets 510 and 520 may share the same GCTRL block 110, the same LCTRL block 106, the same WL driver block 108, the same LIO block 104, and the same GIO block 112, but the LIO block 104 and the GIO block 112 each have respective components for the sets 510 and 520.

For example, the LIO block 104 includes LIO block 104[0] coupled to the set of SRAM cells 510 and LIO block 104[1] coupled to the set of SRAM cells 520. Each of the LIO blocks 104[0] and 104[1] is substantially the same as the LIO block 104 described above, and thus, the description will be briefly described as follows. Each of the LIO blocks 104[0] and 104[1] can include a BLPCH circuit, a number of Y MUX'es, a local read enable control circuit (e.g., 240[0], 240[1]), a read pass-gate circuit, a SAPCH circuit, and a sense amplifier. The read pass-gate circuit, which is activated/deactivated by a local READB signal generated by the corresponding local read enable control circuit, can selectively couple the selected pair of BL/BLB to the corresponding pair of RBL/RBLB. The sense amplifier, which is activated/deactivated by an SAE signal globally generated by the LCTRL block 106, can selectively couple the pair of RBL/RBLB to a corresponding output latch (e.g., Q[0], Q[1]).

Figure 6:
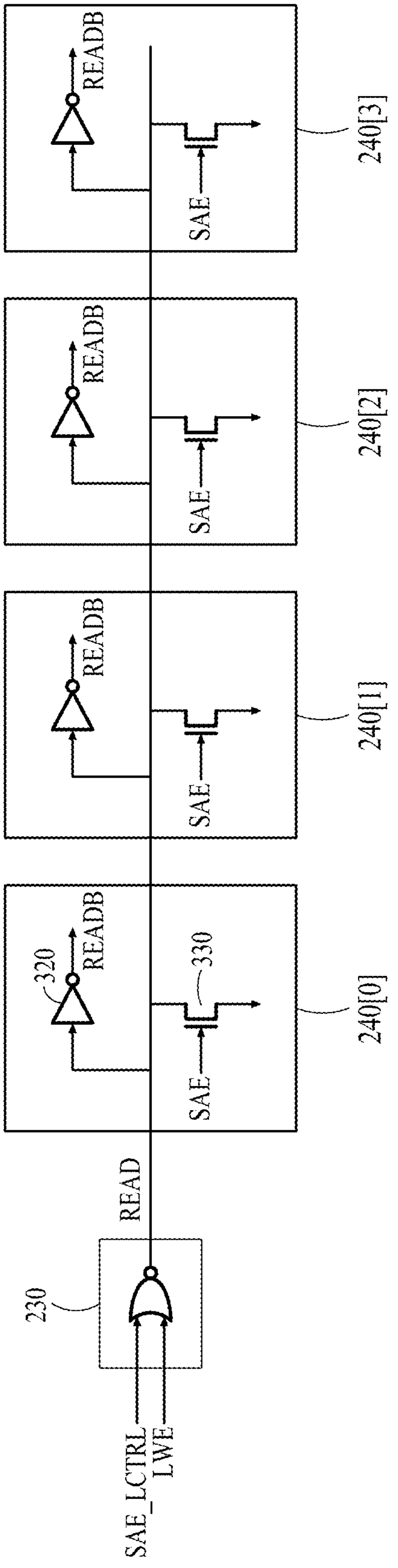
FIG. 6 illustrates an example circuit diagram of the portion of the memory circuit shown in FIG. 5, in accordance with some embodiments.
Figure 7:
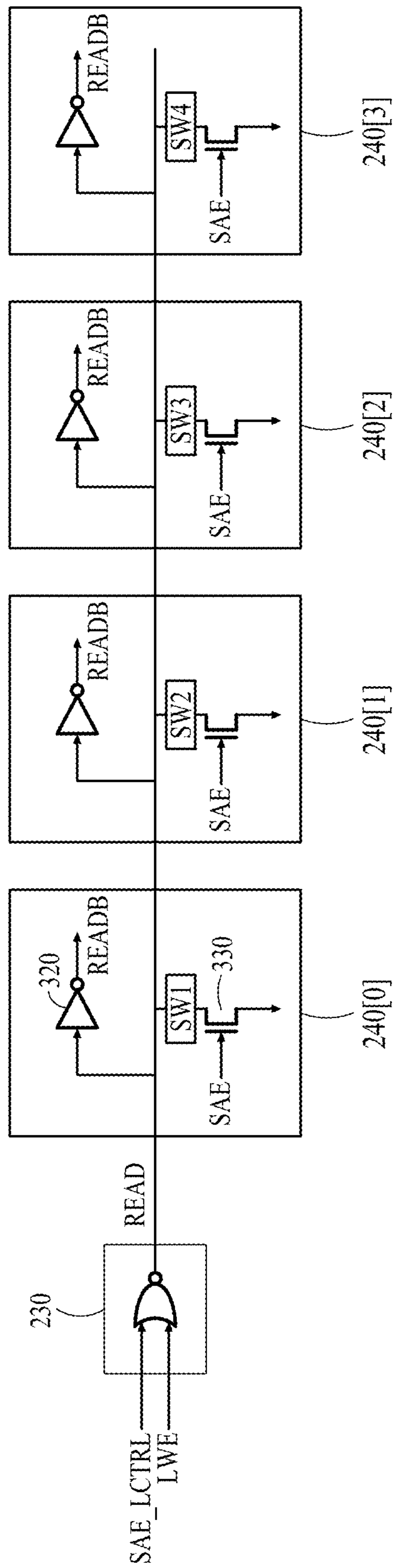
FIG. 7 illustrates another example circuit diagram of the portion of the memory circuit shown in FIG. 5, in accordance with some embodiments.

In the example of FIG. 6, in addition to the local read enable control circuits 240[0] and 240[1], two other local read enable control circuits, 240[2] and 240[3], are shown. Each of the local read enable control circuits 240[0] to 240[3] is substantially similar to the local read enable control circuit shown in FIG. 3, e.g., including an inverter 320 and a transistor 330. Based on the schematic diagram of FIG. 5, the local read enable control circuits 240[0] to 240[3] are coupled to different sets of SRAM cells, respectively. In some implementations, the local read enable control circuits 240[0] to 240[3] can receive the common SAE signal, and provide respective local READB signals.

In the example of FIG. 7, four local read enable control circuits 240[0] to 240[3] are shown, which are substantially similar to FIG. 6 except that each of the local read enable control circuits 240[0] to 240[3] further includes a switch. The local read enable control circuit 240[0] includes a switch SW1 coupled between the global READ signal and the drain terminal of its transistor 330; the local read enable control circuit 240[1] includes a switch SW2 coupled between the global READ signal and the drain terminal of its transistor 330; the local read enable control circuit 240[2] includes a switch SW3 coupled between the global READ signal and the drain terminal of its transistor 330; and local read enable control circuit 240[3] includes a switch SW4 coupled between the global READ signal and the drain terminal of its transistor 330. In some implementations, the local read enable control circuits 240[0] to 240[3] can receive the common SAE signal, and provide respective local READB signals. Further, the switches SW1 and SW3 can be activated concurrently, with the switches SW2 and SW4 concurrently deactivated. The local read enable control circuits 240[0] and 240[2] can be coupled to respective even-numbered output latches, and the local read enable control circuits 240[1] and 240[3] can be coupled to respective odd-numbered output latches.

FIG. 8 illustrates an example circuit diagram of a sense amplifier 800, in accordance with various embodiments of the present disclosure. The sense amplifier 800 can be a non-limiting implementation of the sense amplifier 244 described above. Accordingly, the sense amplifier 800 can be coupled to a pair of RBL and RBLB that can be pre-charged by an SAPCH circuit (e.g., 246), and the RBL and RBLB can be coupled from a selected BL and a selected BLB prior to a sense operation through an activated read pass-gate circuit.

The sense amplifier 800 includes transistors 810, 820, 830, 840, and 850, where the transistors 810 and 820 are each implemented as a PMOS FET and the transistors 830 to 850 are each implemented as an NMOS FET. The transistors 810 and 830 can form a first inverter and the transistors 820 and 840 can form a second inverter, with the first inverter and the second inverter cross-coupled to each other to operatively serve as a latch. The transistor 850, gated by a sense enable signal (e.g., an SAE signal), can serve as a switch of the sense amplifier 800. For example, the sense amplifier 800 can be activated to sense and amplify an input value only when the transistor 850 is activated or turned on.

Prior to the sense operation, nodes DL_IN and DLB_IN are typically pre-charged by a corresponding SAPCH circuit to a voltage less than a supply voltage VDD, for example, VDD/2. After the two nodes DL_IN and DLB_IN are pre-charged, a small voltage sensed from a selected memory cell is coupled onto the sense node DL_IN or DLB_IN; the other node will remain at its pre-charged voltage. Next, the sense amplifier 800 can be enabled by the SAE signal, which causes the transistor 850 to couple the latch (formed by the cross-coupled first and second inverters) to a ground or other voltage supply (this could also be negative, for example) to allow current to flow through transistors 810 to 840. Since one of the inputs DL_IN or DLB_IN will be greater than or less than a threshold potential for one of the transistors, while the other input is at an intermediate value, the latch will latch that input value. The latch can amplify that input value due to the gain of the transistors in the latch, the small signal voltage sensed will be amplified to a full logic value for output to a corresponding output latch.

Figure 9:
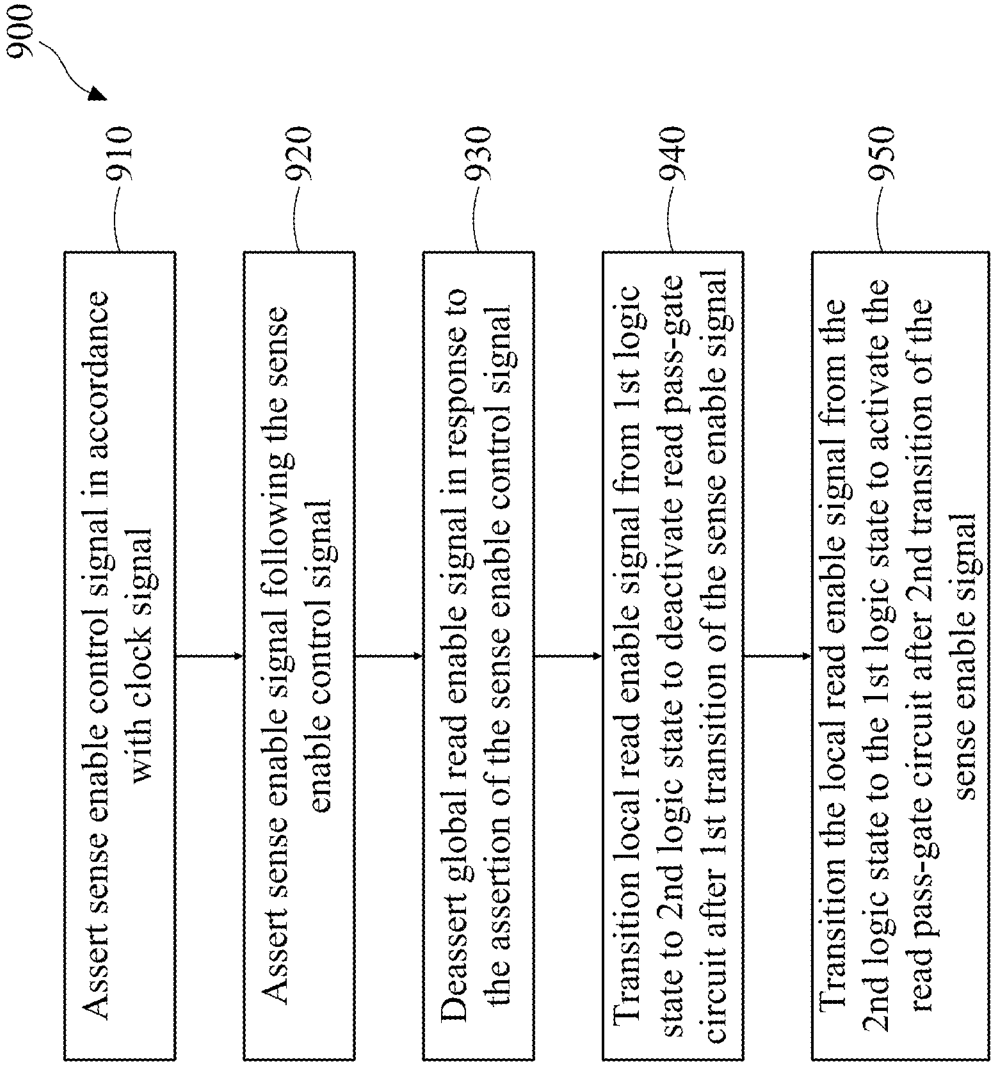
FIG. 9 illustrates an example flow chart for operating a memory circuit, in accordance with some embodiments.

FIG. 9 illustrates a flow chart of an example method 900 for operating a memory circuit, in accordance with various embodiments of the present disclosure. The operations of the method 900 may be performed by the components described above (e.g., FIGS. 2-8), and thus, some of the reference numerals used above may be re-used the following discussion of the method 900. Further, it is understood that the method 900 has been simplified, and thus, additional operations may be provided before, during, and after the method 900 of FIG. 9, and that some other operations may only be briefly described herein.

The method 900 starts with operation 910 of asserting a sense enable control signal in accordance with a transition edge of a clock signal. Using the schematic diagram of FIG. 2 and its circuit diagram of FIG. 3 as a representative example, the sense enable control signal (e.g., SAE_LCTRL signal) is asserted by being pulled up, once the clock signal (e.g., ICLK signal) is pulled up to logic 1. In some embodiments, the clock generator 224 can pull up the ICLK signal, which causes the SA/SAPRB driver 228 to pull up the SAE_LCTRL signal.

The method 900 continues to operation 920 of asserting a sense enable signal that follows the sense enable control signal. With the same example above, when the SAE_LCTRL (sense enable control) signal is pulled up, the sense enable signal (e.g., SAE signal) can be asserted by being pulled up. In some embodiments, the SAE_LCTRL signal is logically inverted as SAEB signal through a first inverter, and the SAE signal is logically inverted from the SAEB signal through a second inverter.

The method 900 continues to operation 930 of deasserting a global read enable signal, in response to the assertion of the sense enable control signal. Further, when the SAE_LCTRL (sense enable control) signal is pulled up, the global read enable signal (e.g., READ) can be deasserted by being pulled down through the global read enable control circuit 230. The global read enable control circuit 230 includes a NOR gate receiving the SAE_LCTRL signal and LWE signal as inputs.

The method 900 continues to operation 940 of transitioning a local read enable signal from a first logic state to a second logic state so as to deactivate a read pass-gate circuit after a first transition of the sense enable signal. Continuing with the same example, after the SAE signal transitions to logic 1 to turn on the transistor 330 of the local read enable control circuit 240, the global READ signal is pulled down to ground, which causes the local read enable signal (e.g., READB signal) to be asserted, e.g., transitioning to logic 1. Consequently, the read pass-gate circuit (e.g., PMOS FETs 250 and 252) is deactivated to decouple the selected pair of BL/BLB from the pair of RBL/RBLB of a sense amplifier.

The method 900 continues to operation 950 of transitioning the local read enable signal from the second logic state to the first logic state so as to activate the read pass-gate circuit after a second transition of the sense enable signal. Continuing with the same example, after the SAE signal transitions to logic 0 (e.g., following the sense operation being finished), the transistor 330 of the local read enable control circuit 240 is turned off, which decouples an output node of the NOR gate (of the global read enable control circuit 230) from ground. As such, it can be assured that the READB signal transitions to logic 0 after the SAE signal transitions to logic 0, with a large enough time margin. Consequently, the read pass-gate circuit (e.g., PMOS FETs 250 and 252) is activated to couple the selected pair of BL/BLB to the pair of RBL/RBLB of the sense amplifier, enabling a next read operation.

In some embodiments, a signal is referred to as being asserted when the signal is pulled up from logic 0 to logic 1. Similarly, a signal is referred to as being deasserted when the signal is pulled down from logic 1 to logic 0. However, in some other embodiments, the polarity of a circuit component (e.g., one or more transistors) controlled (e.g., gated) by the signal may change. As such, it should be understood that the signal may be referred to as being asserted and deasserted when being pulled down and pulled up, respectively, while remaining within the scope of the present disclosure.

In one aspect of the present disclosure, a memory circuit is disclosed. The memory circuit includes a first memory cell operatively accessible through a first access line and a second access line; a first read pass-gate transistor and a second read pass-gate transistor coupled to the first access line and second access line, respectively; a first sense amplifier coupled to the first access line and the second access line; a first read enable control circuit configured to generate a first read enable signal based on a clock signal; and a second read enable control circuit configured to generate a second read enable signal by logically inverting the first read enable signal, wherein the first read enable signal selectively transitions to a different logic state based on a first sense enable signal. The second read enable signal is configured to activate or deactivate both the first and second read pass-gate transistors, and the first sense enable signal is configured to activate or deactivate the first sense amplifier.

In another aspect of the present disclosure, a memory circuit is disclosed. The memory circuit includes a memory array comprising a plurality of memory cells; an input/output (I/O) circuit operatively coupled to the memory array and physically disposed next to the memory array along a first lateral direction, wherein the I/O circuit comprises a plurality of read pass-gate circuits operatively coupled to different sets of the memory cells, respectively, and a plurality of sense amplifiers operatively coupled to the different sets of the memory cells, respectively; and a control circuit operatively coupled to the memory array and physically disposed next to the I/O circuit along a second lateral direction perpendicular to the first lateral direction. The control circuit comprises a global read enable control circuit, and the I/O circuit comprises a plurality of local read enable control circuits each operatively coupled to a corresponding one of the plurality of read pass-gate circuits. The global read enable control circuit is configured to generate a first read enable signal based on a sense enable control signal, and each of the local read enable control circuits is configured to generate a respective second read enable signal for the corresponding read pass-gate circuit based on the sense enable control signal.

In yet another aspect of the present disclosure, a method for operating a memory circuit is disclosed. The method includes asserting a sense enable control signal in accordance with a transition edge of a clock signal. The method includes asserting a sense enable signal that follows the sense enable control signal. The method includes deasserting a global read enable signal, in response to the sense enable control signal being asserted. The method includes deactivating, by transitioning a local read enable signal from a first logic state to a second logic state, a read pass-gate circuit after the sense enable signal is asserted. The method includes activating, by transitioning the local read enable signal from the second logic state to the first logic state, the read pass-gate circuit after the sense enable signal is deasserted.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:

a first memory cell operatively accessible through a first access line and a second access line;

a first read pass-gate transistor and a second read pass-gate transistor coupled to the first access line and the second access line, respectively;

a first sense amplifier coupled to the first access line and the second access line;

a first read enable control circuit configured to generate a first read enable signal based on a clock signal, wherein the first read enable circuit comprises a NOR gate located in a local control region of the memory circuit; and a second read enable control circuit configured to generate a second read enable signal by logically inverting the first read enable signal, wherein the first read enable signal selectively transitions to a different logic state based on a first sense enable signal, the second read enable control circuit located in a local input/output region of the memory circuit;

wherein the second read enable signal is generated in the local input/output region of the memory circuit by the second read enable control circuit, wherein the second read enable signal is configured to activate or deactivate both the first read pass-gate transistor and the second read pass-gate transistor, and the first sense enable signal is configured to activate or deactivate the first sense amplifier.

2. The memory circuit of claim 1, wherein the second read enable control circuit comprises an inverter and a transistor.

3. The memory circuit of claim 2, wherein the NOR gate has a first input configured to receive a write enable signal, a second input configured to receive a sense enable control signal that is generated according to the clock signal, and an output configured to output the first read enable signal, and wherein the first sense enable signal follows the sense enable control signal.

4. The memory circuit of claim 3, wherein the inverter has an input configured to receive the first read enable signal and an output configured to provide the second read enable signal, and the transistor has a gate terminal connected to the first sense enable signal, a drain terminal connected to the first read enable signal, and a source terminal connected to ground.

5. The memory circuit of claim 1, wherein only after the first sense enable signal transitions from a first logic state to a second logic state to activate the first sense amplifier, the second read enable control circuit is configured to deactivate both the first read pass-gate transistor and the second read pass-gate transistor based on coupling the first read enable signal to ground.

6. The memory circuit of claim 5, wherein only after the first sense enable signal transitions from the second logic state to the first logic state to deactivate the first sense amplifier, the second read enable control circuit is configured to cause both the first read pass-gate transistor and the second read pass-gate transistor to remain deactivated for a period of time based on decoupling the first read enable signal from the ground.

7. The memory circuit of claim 1, further comprising:

a second memory cell operatively accessible through a third access line and a fourth access line;

a third read pass-gate transistor and a fourth read pass-gate transistor coupled to the third access line and the fourth access line, respectively;

a second sense amplifier coupled to the third access line and the fourth access line; and a third read enable control circuit configured to generate a third read enable signal by logically inverting the first read enable signal that selectively transitions to a different logic state based on a second sense enable signal;

wherein the third read enable signal is configured to activate or deactivate both the third read pass-gate transistor and the fourth read pass-gate transistor, and the second sense enable signal is configured to activate or deactivate the second sense amplifier.

8. The memory circuit of claim 7, wherein the second read enable control circuit is physically located next to the first memory cell along a first lateral direction and the third read enable control circuit is physically located next to the second memory cell along the first lateral direction, with the first read enable control circuit physically disposed next to the second read enable control circuit and the third read enable control circuit along a second lateral direction perpendicular to the first lateral direction.

9. The memory circuit of claim 7, wherein the first access line and the second access line belong to a first array, and the third access line and the fourth access line belong to a second array.

10. The memory circuit of claim 9, wherein the second read enable control circuit and the third read enable control circuit are alternately activated.

11. A memory circuit, comprising:

a memory array comprising a plurality of memory cells;

an input/output (I/O) circuit operatively coupled to the memory array and physically disposed next to the memory array along a first lateral direction, wherein the I/O circuit comprises a plurality of read pass-gate circuits operatively coupled to different sets of the plurality of memory cells, respectively, and a plurality of sense amplifiers operatively coupled to the different sets of the plurality of memory cells, respectively; and a control circuit operatively coupled to the memory array and physically disposed next to the I/O circuit along a second lateral direction perpendicular to the first lateral direction;

wherein the control circuit comprises a global read enable control circuit, and the I/O circuit comprises a plurality of local read enable control circuits each operatively coupled to a corresponding one of the plurality of read pass-gate circuits; and wherein the global read enable control circuit is configured to generate a first read enable signal based on a sense enable control signal, and each of the plurality of local read enable control circuits is configured to generate a second read enable signal for the corresponding read pass-gate circuit based on the sense enable control signal.

12. The memory circuit of claim 11, wherein the global read enable control circuit comprises a NOR gate, and each of the plurality of local read enable control circuits comprises an inverter and a transistor.

13. The memory circuit of claim 12, wherein the NOR gate has a first input configured to receive a write enable signal, a second input configured to receive the sense enable control signal that is generated according to a clock signal, and an output configured to output the first read enable signal.

14. The memory circuit of claim 13, wherein the inverter has an input configured to receive the first read enable signal and an output configured to provide the second read enable signal, and the transistor has a gate terminal connected to a sense enable signal, a drain terminal connected to the first read enable signal, and a source terminal connected to ground.

15. The memory circuit of claim 14, wherein the sense enable signal follows the sense enable control signal to selectively activate a corresponding one of the plurality of sense amplifiers.

16. The memory circuit of claim 15, wherein after the sense enable signal activates the corresponding one of the plurality of sense amplifiers, each of the plurality of local read enable control circuits is configured to deactivate the corresponding one of the plurality of read pass-gate circuits through turning on a corresponding transistor to couple the first read enable signal to the ground.

17. The memory circuit of claim 16, wherein after the sense enable signal deactivates the corresponding one of the plurality of sense amplifiers, each of the plurality of local read enable control circuits is configured to cause the corresponding one of the plurality of read pass-gate circuits to remain deactivated for a period of time through turning off the corresponding transistor to decouple the first read enable signal from the ground.

18. The memory circuit of claim 11, wherein the global read enable control circuit comprises a NOR gate, and each of the plurality of local read enable control circuits comprises an inverter, a switch, and a transistor.

19. A method for operating a memory circuit, comprising:

asserting a sense enable control signal in accordance with a transition edge of a clock signal;

asserting a sense enable signal that follows the sense enable control signal;

deasserting a global read enable signal, in response to the sense enable control signal being asserted;

deactivating, by transitioning a local read enable signal from a first logic state to a second logic state, a read pass-gate circuit after the sense enable signal is asserted; and activating, by transitioning the local read enable signal from the second logic state to the first logic state, the read pass-gate circuit after the sense enable signal is deasserted.

20. The method of claim 19, wherein the local read enable signal is pulled up based on coupling the global read enable signal to ground, and wherein the local read enable signal is pulled down based on decoupling the global read enable signal from the ground.

* * * * *